US006359453B1

(12) United States Patent
Forbis et al.

(10) Patent No.: US 6,359,453 B1

(45) Date of Patent: Mar. 19, 2002

(54) VERTICAL PROBE CARD FOR ATTACHMENT WITHIN A CENTRAL CORRIDOR OF A MAGNETIC FIELD GENERATOR

(75) Inventors: James M. Forbis; Dennis J. Cahalan, both of Longmont, CO (US)

(73) Assignee: Veeco Instruments Inc., Woodbury, NY (US)

( * ) Notice: Subject to any disclaimer, the term of this patent is extended or adjusted under 35 U.S.C. 154(b) by 0 days.

(21) Appl. No.: 09/255,477

(22) Filed: Feb. 23, 1999

(51) Int. Cl.$^7$ ........................ G01R 31/02; G01R 31/311

(52) U.S. Cl. ........................ 324/754; 324/761; 324/762; 324/529

(58) Field of Search ................................ 324/754, 762, 324/758, 761, 529

(56) References Cited

U.S. PATENT DOCUMENTS

| | | | | | |
|---|---|---|---|---|---|
| 4,126,380 | A | * | 11/1978 | Borm | 359/227 |
| 4,833,402 | A | * | 5/1989 | Boegh-Petersen | 324/754 |
| 5,517,126 | A | * | 5/1996 | Yamaguchi | 324/758 |
| 6,034,533 | A | * | 3/2000 | Tervo et al. | 324/762 |
| 6,040,704 | A | * | 3/2000 | Kondo et al. | 324/762 |

* cited by examiner

*Primary Examiner*—Glenn W. Brown
*Assistant Examiner*—Anjan K Deb
(74) *Attorney, Agent, or Firm*—Nilles & Nilles, S.C.

(57) ABSTRACT

A vertical probe card assembly containing a plurality of vertical probe cards is mounted within a central corridor or opening within a magnetic field generator. Each of the vertical probe cards has a multiplicity of probe needles extending downwardly therefrom for electrically contacting test pads of a device under test that is positioned below the magnetic field generator.

2 Claims, 13 Drawing Sheets

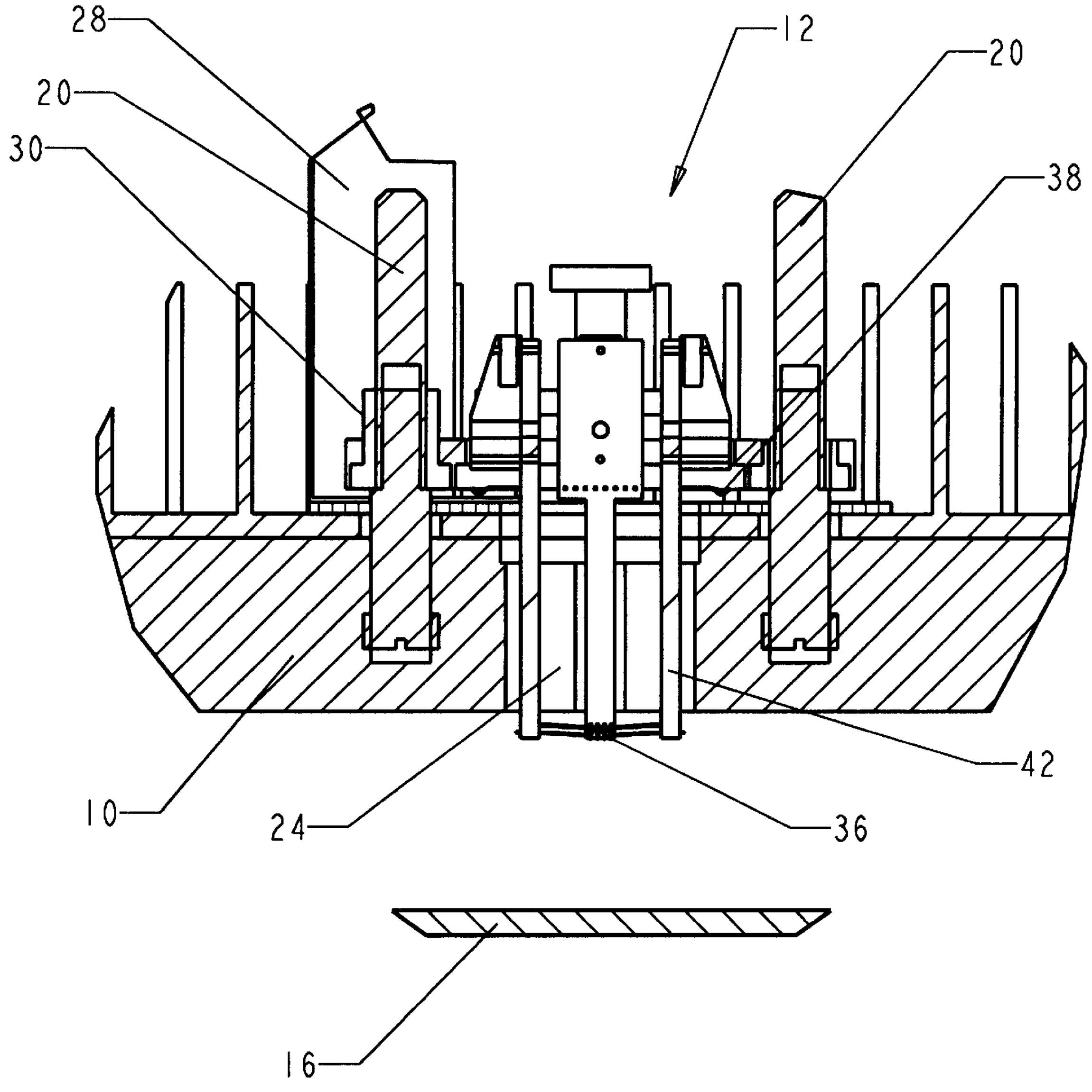
FIGURE IF

VERTICAL PROBE CARD FOR ATTACHMENT WITHIN A CENTRAL CORRIDOR OF A MAGNETIC FIELD GENERATOR

BACKGROUND AND SUMMARY OF THE INVENTION

This invention relates generally to test equipment which is utilized to establish electrical contact with electrical/electronic devices during testing thereof and, more particularly, to a magnetic field generator having a plurality of vertical probe cards mounted within a central corridor or opening thereof.

Horizontal printed circuit probe cards are known in the prior art. Probe needles electrically attached to the card protrude downwardly through a hole therein to a plane in which the electronic device under test is positioned. By accurately positioning the ends of the probe needles on conductive pads of the device under test, the user may establish electrical contact therewith for the purpose of measuring certain electrical parameters thereof. Two embodiments of this prior art test method are known as the blade card implementation and the epoxy ring implementation. The blade card implementation utilizes electrically conductive blades that are soldered to the horizontal circuit card. These blades also have small needles affixed to them for the purpose of contacting test pads of the device under test by penetration through the hole in the horizontal card. The epoxy ring implementation involves probe needles accurately located and restrained by an epoxy ring. The epoxy ring is affixed to the horizontal probe card, and the individual probe needles are electrically attached thereto. The ends of the probe needles penetrate through a hole in the horizontal probe card to make electrical contact with test pads of the device under test.

Some testing processes require the addition of a magnetic field to stimulate the devices under test. As a practical matter, it is desirable to locate the magnetic field generator as close as possible to the device under test. In order to accomplish this objective, the blade or epoxy ring type of horizontal card with probe needles must not reside between the device under test and the magnetic field generator. A corridor or opening in the center of the magnetic field generator can be utilized to facilitate placement of the probing mechanism above the magnetic field generator. Although either one of the two embodiments of the horizontal probe card may be utilized in this configuration, they each have deficiencies which render them undesirable.

The blade card, when used to probe through a corridor in a magnet, is very limited in the number of probe needles it can carry due to the large space requirements of each blade. This restriction severely limits the ability of the test system to evaluate the device under test. In addition, due to the required spacing of the probes, an induced voltage will be observed when the magnetic field is applied. If this spacing were somehow reduced, the induced voltage would also be substantially reduced.

The epoxy ring card is not functional when used to probe through a corridor in a magnet due to the length requirement of the probe needles. The result is that the contact force which the longer probe needles are able to exert on the test pads of the device under test is so low as to result in poor electrical contact.

It would therefore be advantageous to provide a vertical probe card for probing a device under test through a corridor in a magnetic field generator, while locating the device under test as close to the magnetic field generator as possible. It would also be advantageous to densely locate the traces on the vertical probe card in order to reduce the effect of the magnetic field on the test measurement. An additional advantage of such a vertical probe card is to provide a rigid structure to support the probe needles just above the device under test and to provide support for long probe needles that are required to reach relatively long distances.

BRIEF DESCRIPTION OF THE DRAWINGS

FIG. 1F is a more detailed view of the indicated portion of the sectional diagram of FIG. 1E.

DESCRIPTION OF THE PREFERRED EMBODIMENTS

Figure 5A:
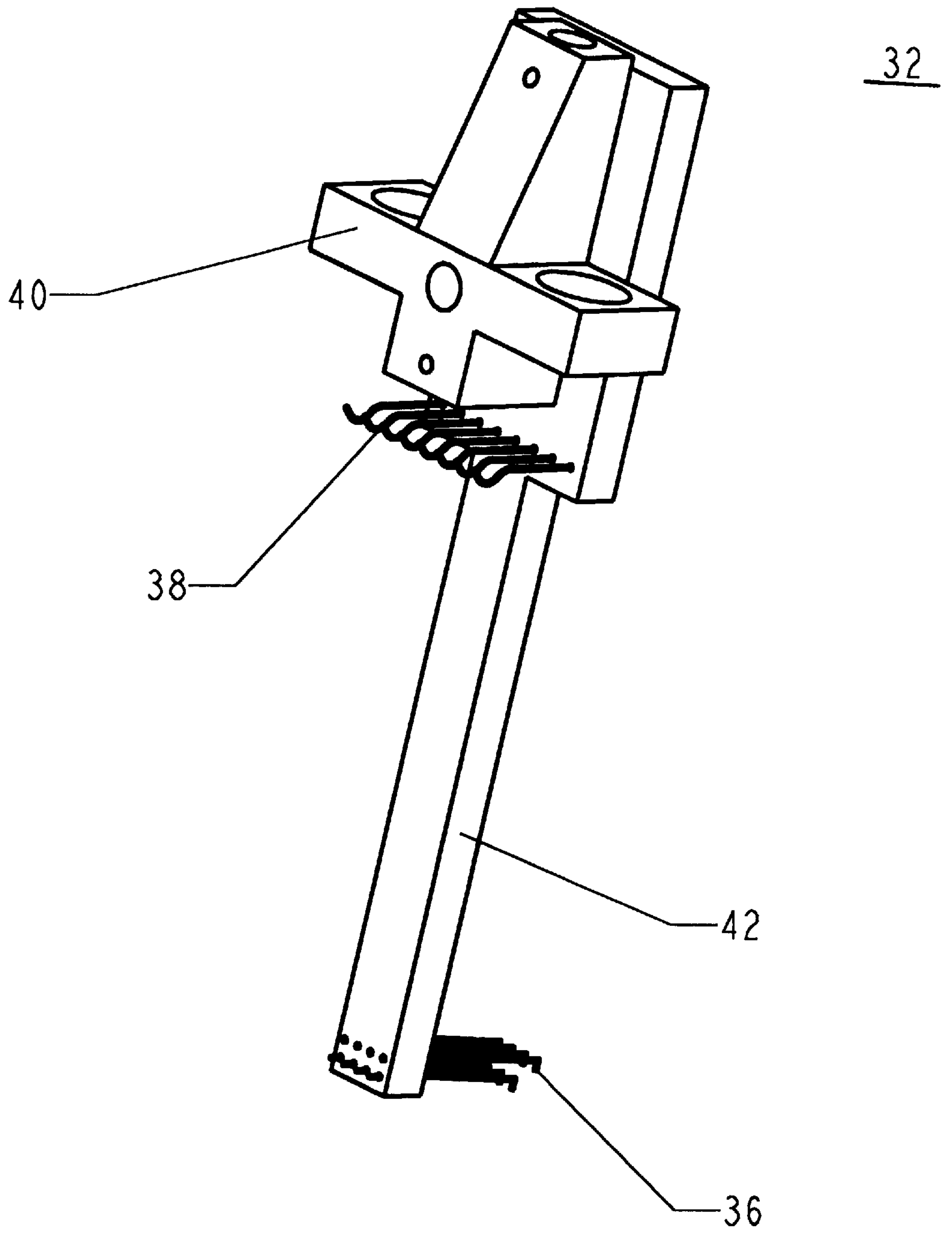
FIG. 5A is rear pictorial diagram of one of the vertical probe cards of the vertical probe card assembly of FIGS. 4A–B.
Figure 5B:
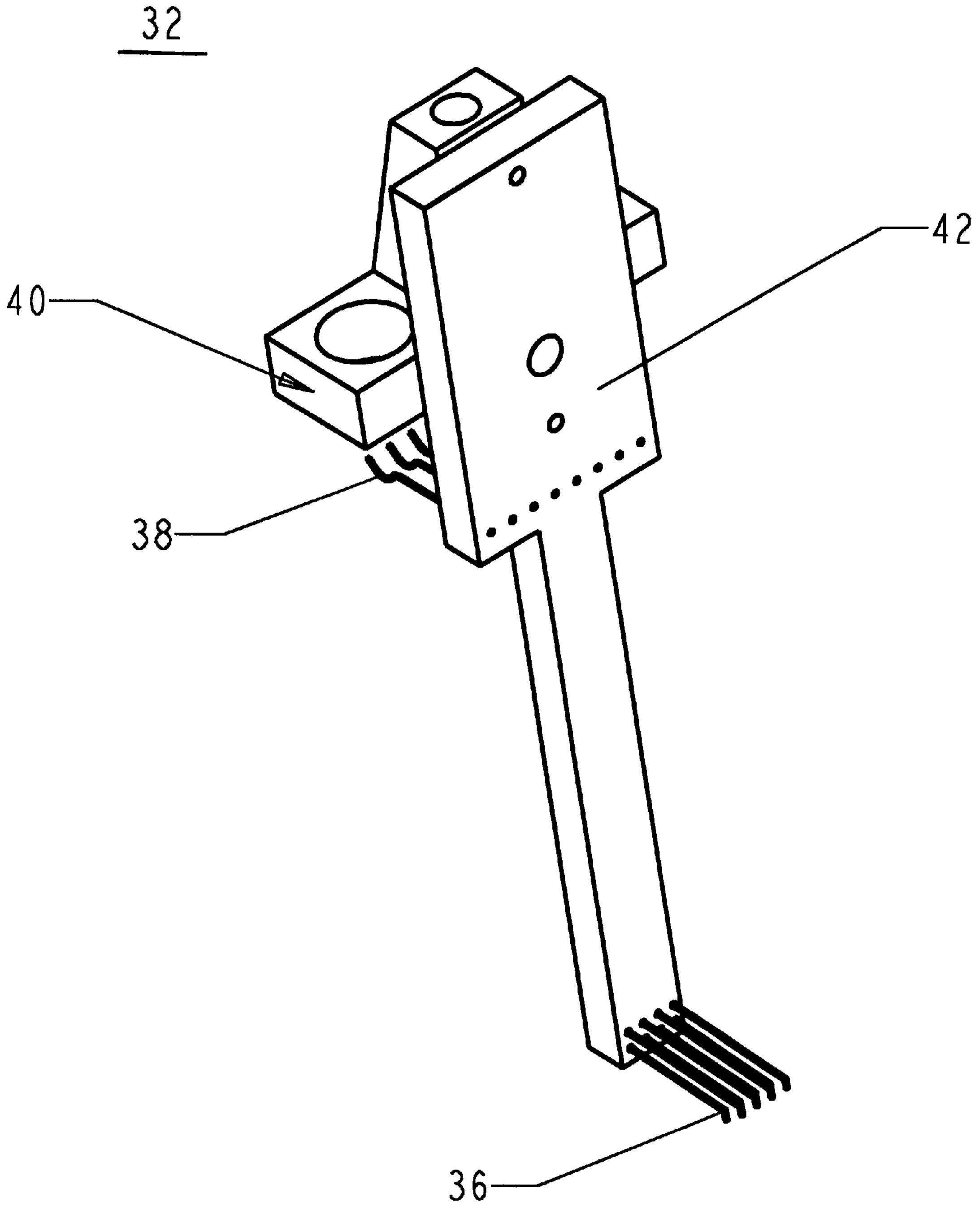
FIG. 5B is a front pictorial diagram of the vertical probe card of FIG. 5A.

Referring first to FIGS. 5A–B, there is shown a vertical probe card 42 in accordance with the present invention. A multiplicity of probe needles 36 are attached to the probe card 42 so as to make electrical contact with corresponding electrically conductive traces within the probe card 42. The electrically conductive traces make electrical contact with a multiplicity of interface needles 38 which are attached to the probe card 42. The probe card 42 with the probe needles 36 and the interface needles 38 attached thereto is hereinafter referred to as probe card/mount assembly 32 and is secured to a probe card mount 40 using any one of a number of conventional fastening methods.

Figure 4A:
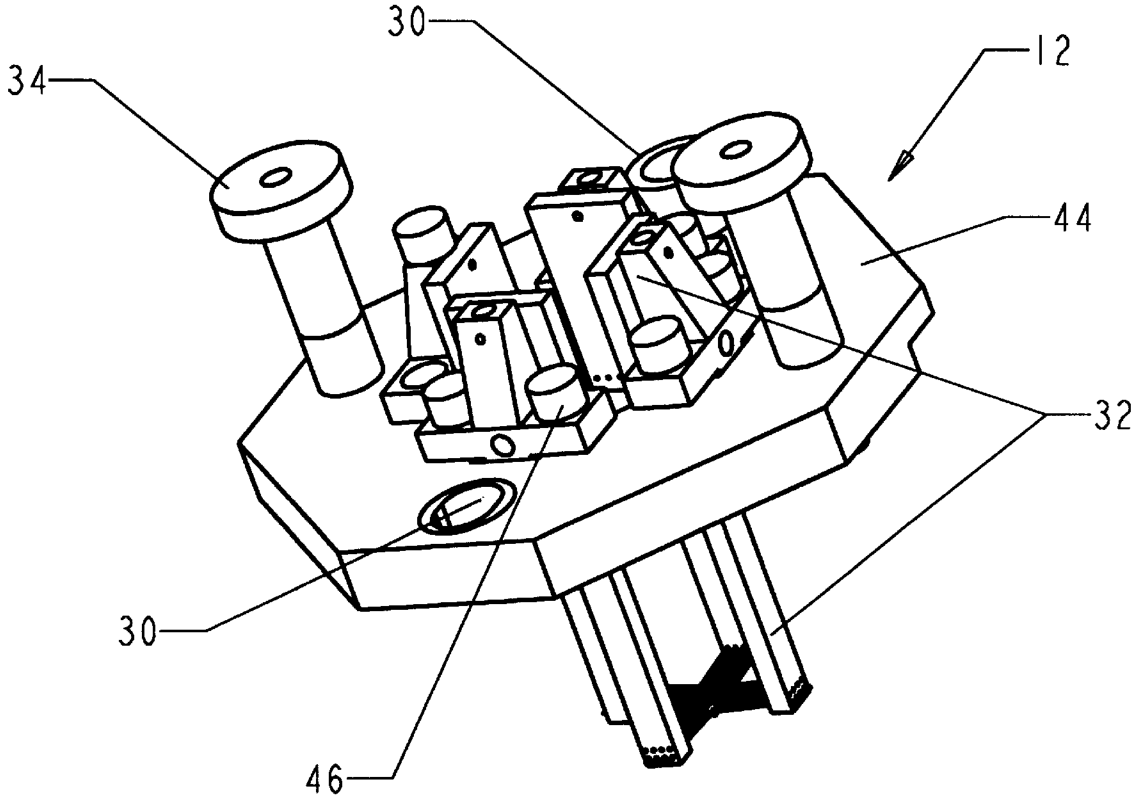
FIG. 4A is a top pictorial diagram of the vertical probe card assembly of FIGS. 1A–E.
Figure 4B:
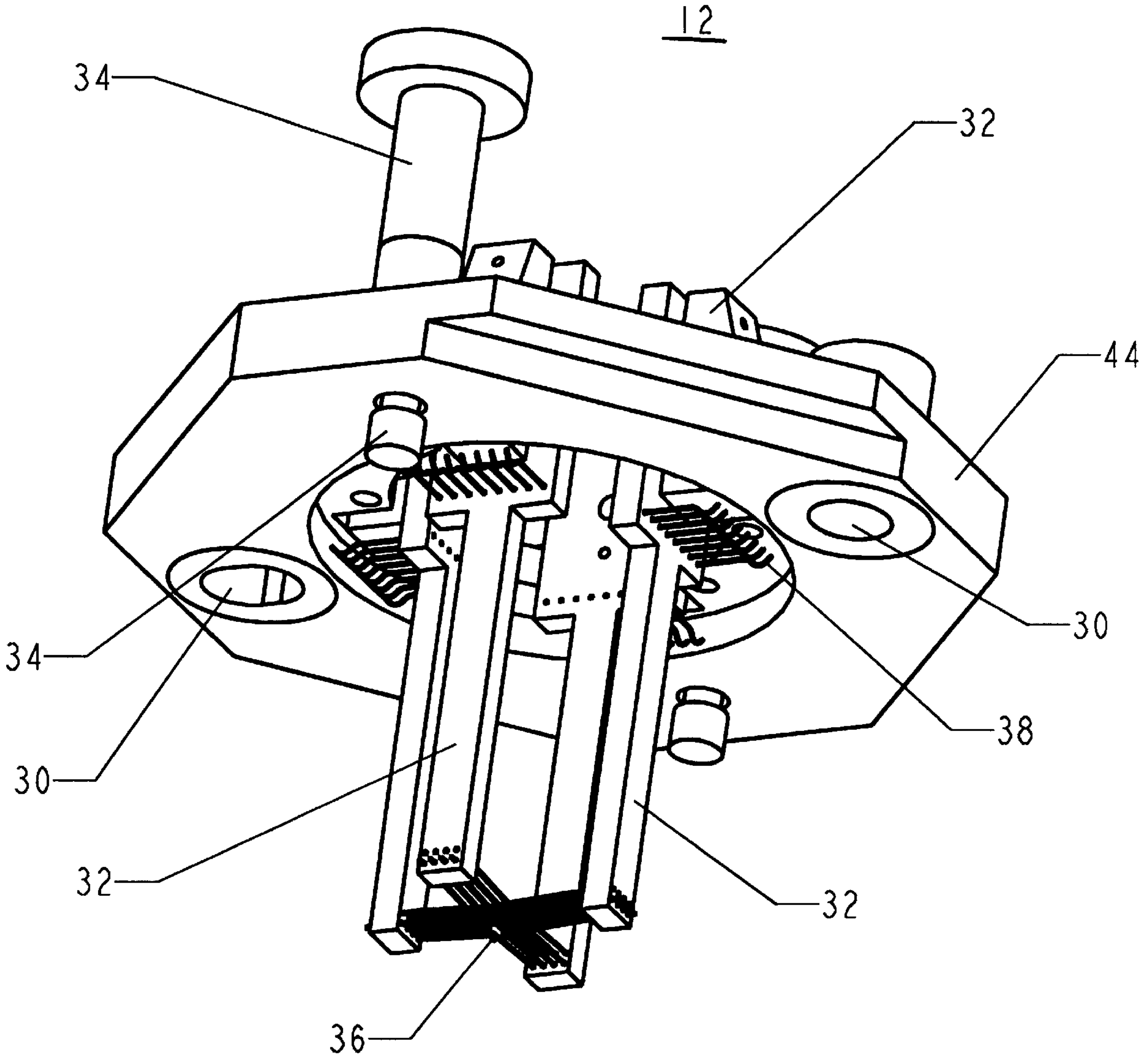
FIG. 4B is a bottom pictorial diagram of the vertical probe card assembly of FIG. 4A.

Referring now to FIGS. 4A–B, the probe card/mount assembly 32 is placed on the top surface of an elevator platen 44 with the probe card 42 protruding downwardly through a central opening in the elevator platen 44, thus orienting the probe needles 36 downwardly. The probe card/mount assembly 32 is secured to the elevator platen 44 by two machine screws 46. A probe card/elevator assembly 12 may include up to four probe card/mount assemblies 32 mounted to the elevator platen 44.

Two elevator guide sleeves 30 are affixed to the probe card/elevator assembly 12. A hole in each elevator guide sleeve 30 is of an appropriate size to slip freely over a guide pin 20 of FIG. 2A that is located within a magnetic field generator assembly 10. Two hold down screws 34 are attached to the probe card/elevator assembly 12. Each of the hold down screws 34 threads into a hold down nut 22 located within the magnetic field generator assembly 10 to secure the probe card/elevator assembly 12 to the magnetic field generator assembly 10.

Figure 2A:
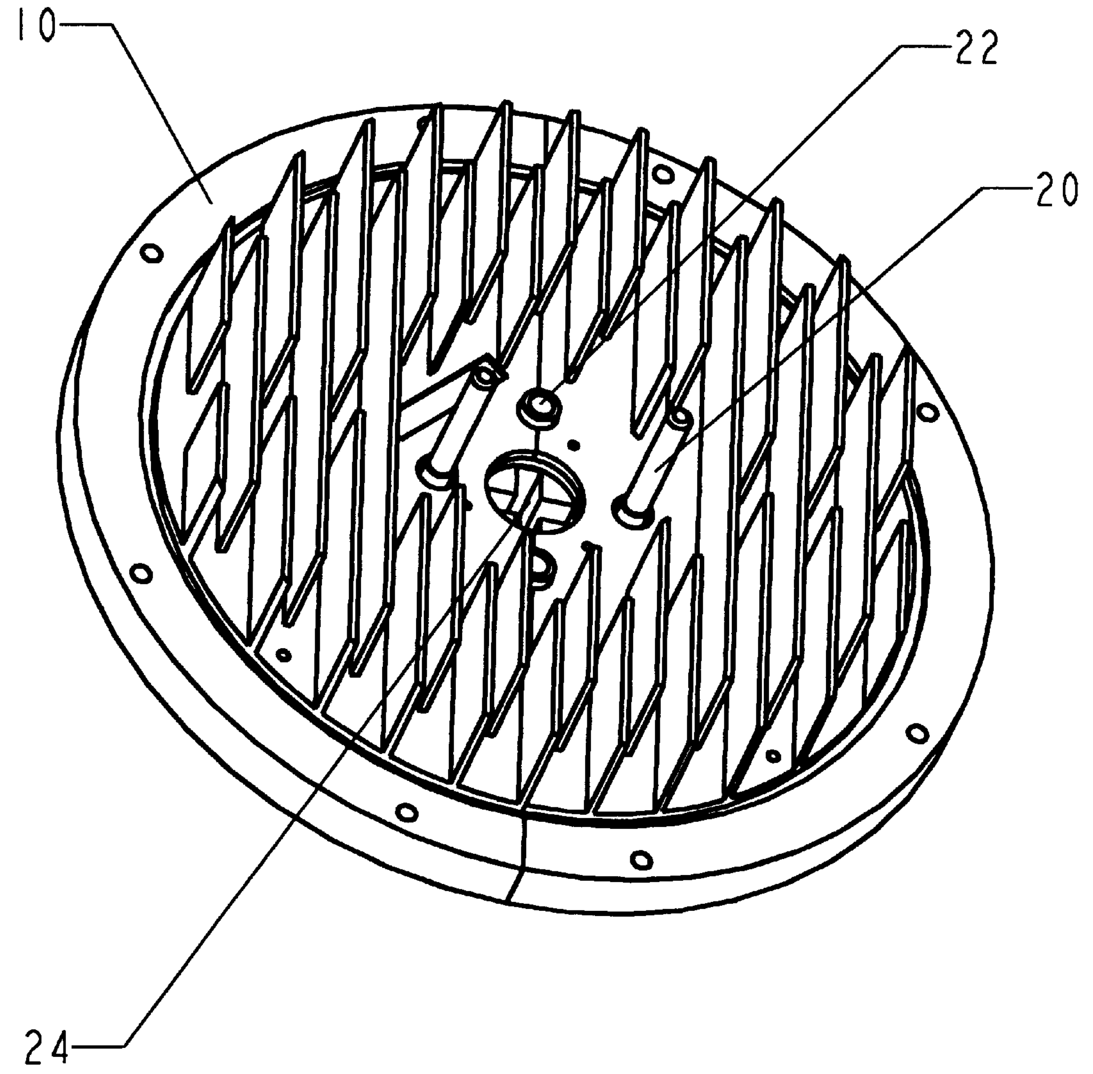
FIG. 2A is a top pictoral diagram of the magnetic field generator of FIGS. 1A–E.
Figure 2B:
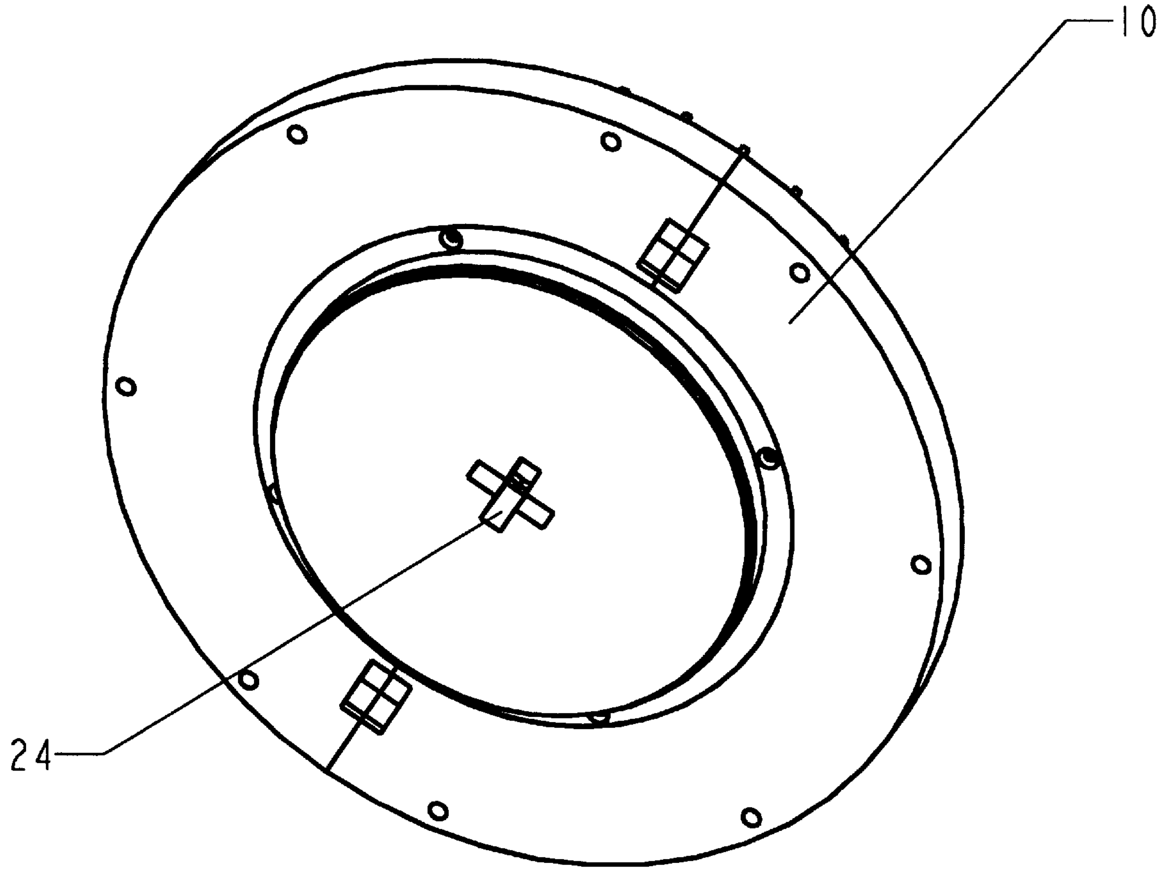
FIG. 2B is a bottom pictorial diagram of the magnetic field generator of FIG. 2A.
Figure 3:
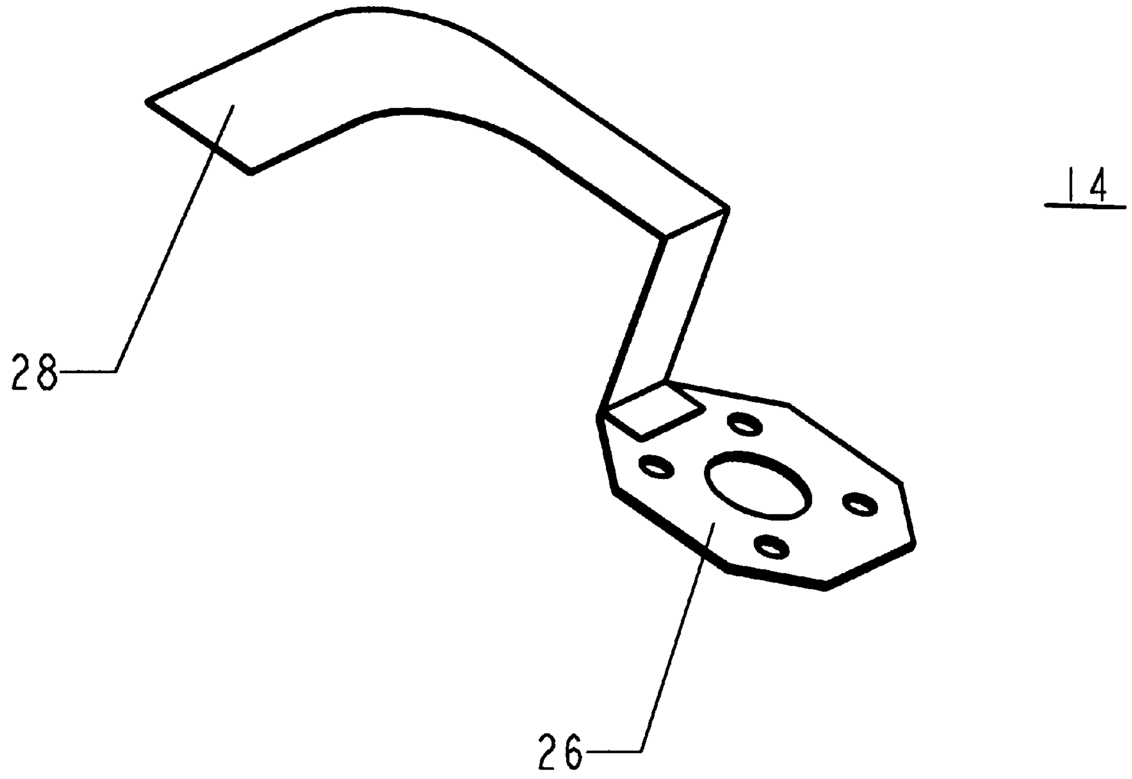
FIG. 3 is a pictorial diagram of the interface/flex lead assembly of FIGS. 1A–E.

An interface/flex lead assembly 14 is attached to the magnetic field generator assembly 10 of FIG. 2A such that an interface card 26 is oriented correctly by the guide pins 20. This orientation assures that all of the interface needles 38 of FIG. 5A will contact the interface card 26 correctly to make proper electrical contact between the two electrically conductive components. The interface/flex lead assembly 14 comprises an interface card 26 and a flex lead 28 electrically connected together.

The magnetic field generator of FIG. 2A includes a corridor 24 which represents a central opening between the top and bottom thereof. Corridor 24 provides clearance through the magnetic field generator 10 to allow the probe card/elevator assembly 12 to pass completely through the magnetic field generator 10, thereby exposing the probe needles 36 of FIG. 5B below the magnetic field generator 10.

Figure 1A:
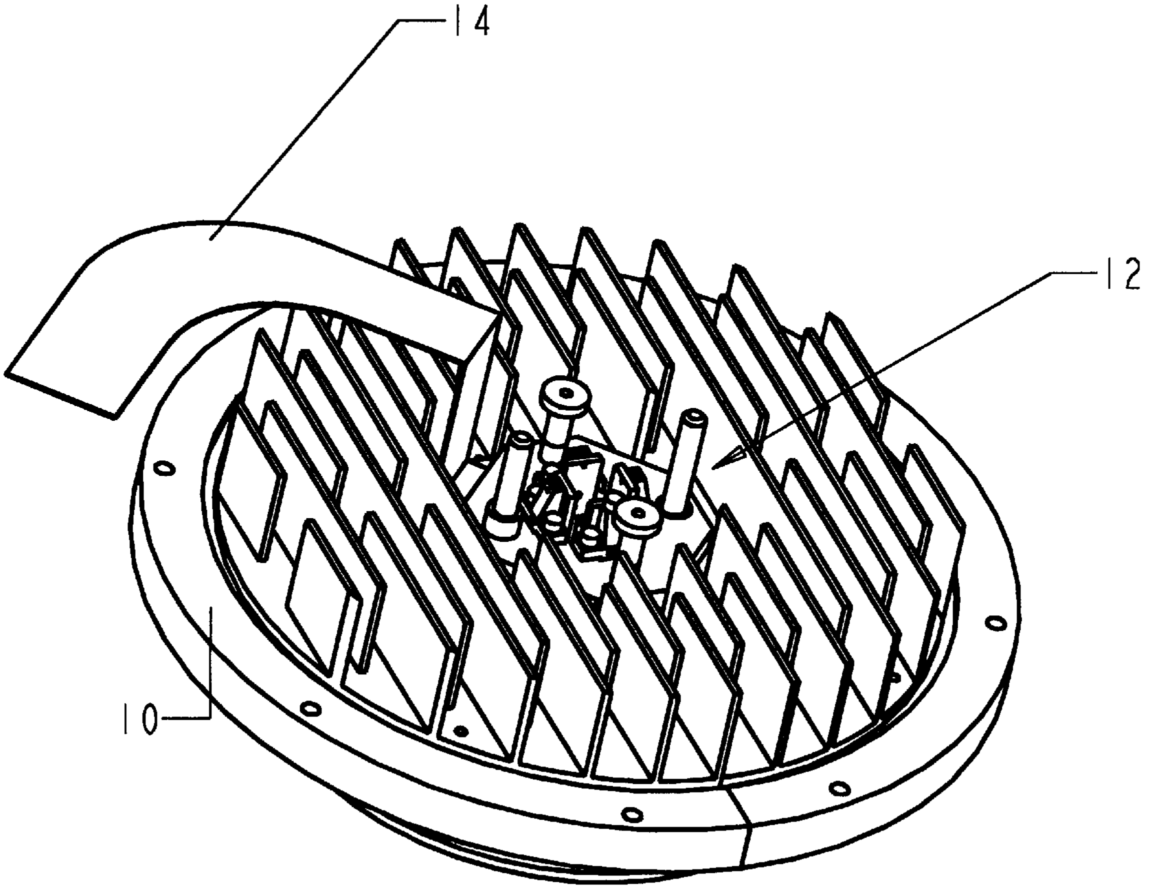
FIG. 1A is a top pictorial diagram of a magnetic field generator in association with a vertical probe card assembly and an interface/flex lead assembly in accordance with the present invention.
Figure 1B:
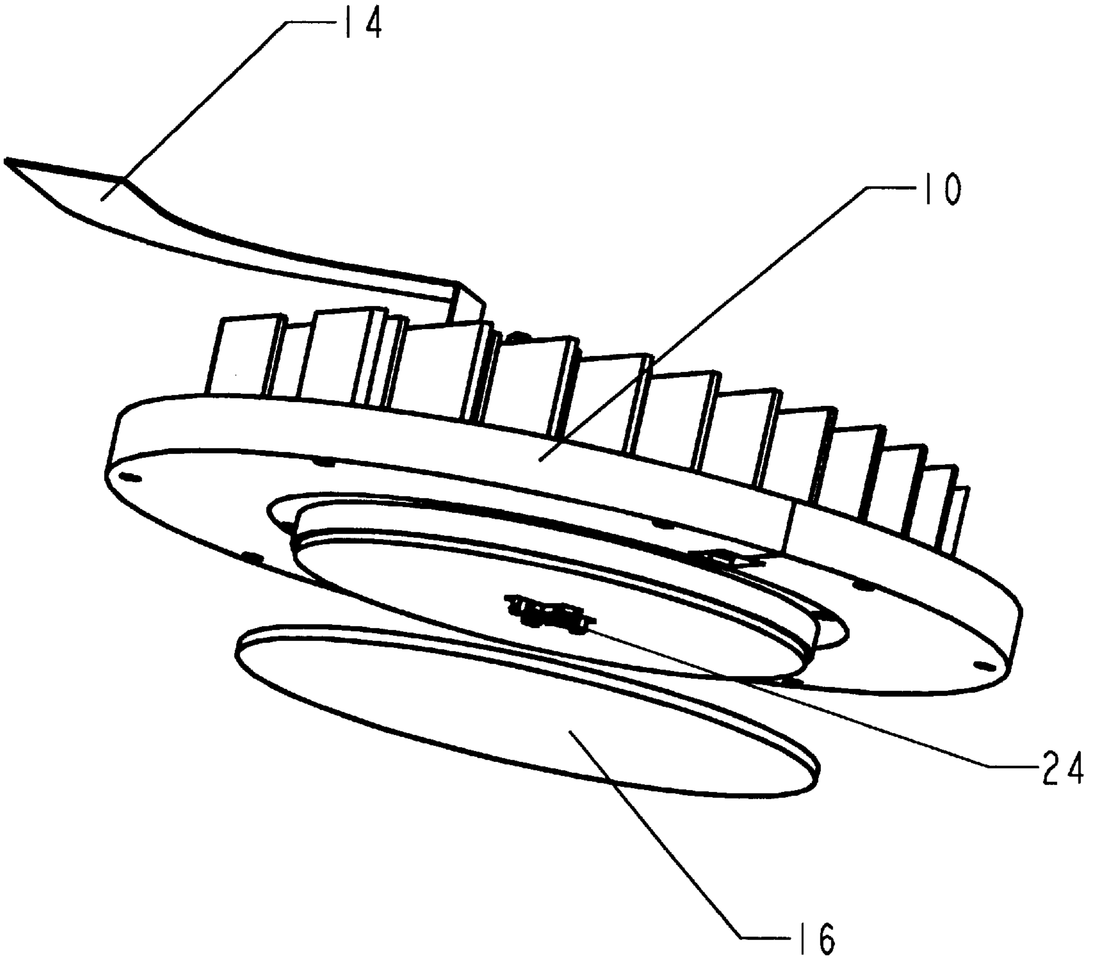
FIG. 1B is a bottom pictorial diagram of the magnetic field generator, vertical probe card assembly, and interface/flex lead assembly of FIG. 1A illustrating the position thereof relative to an electrical/electronic device under test.
Figure 1C:
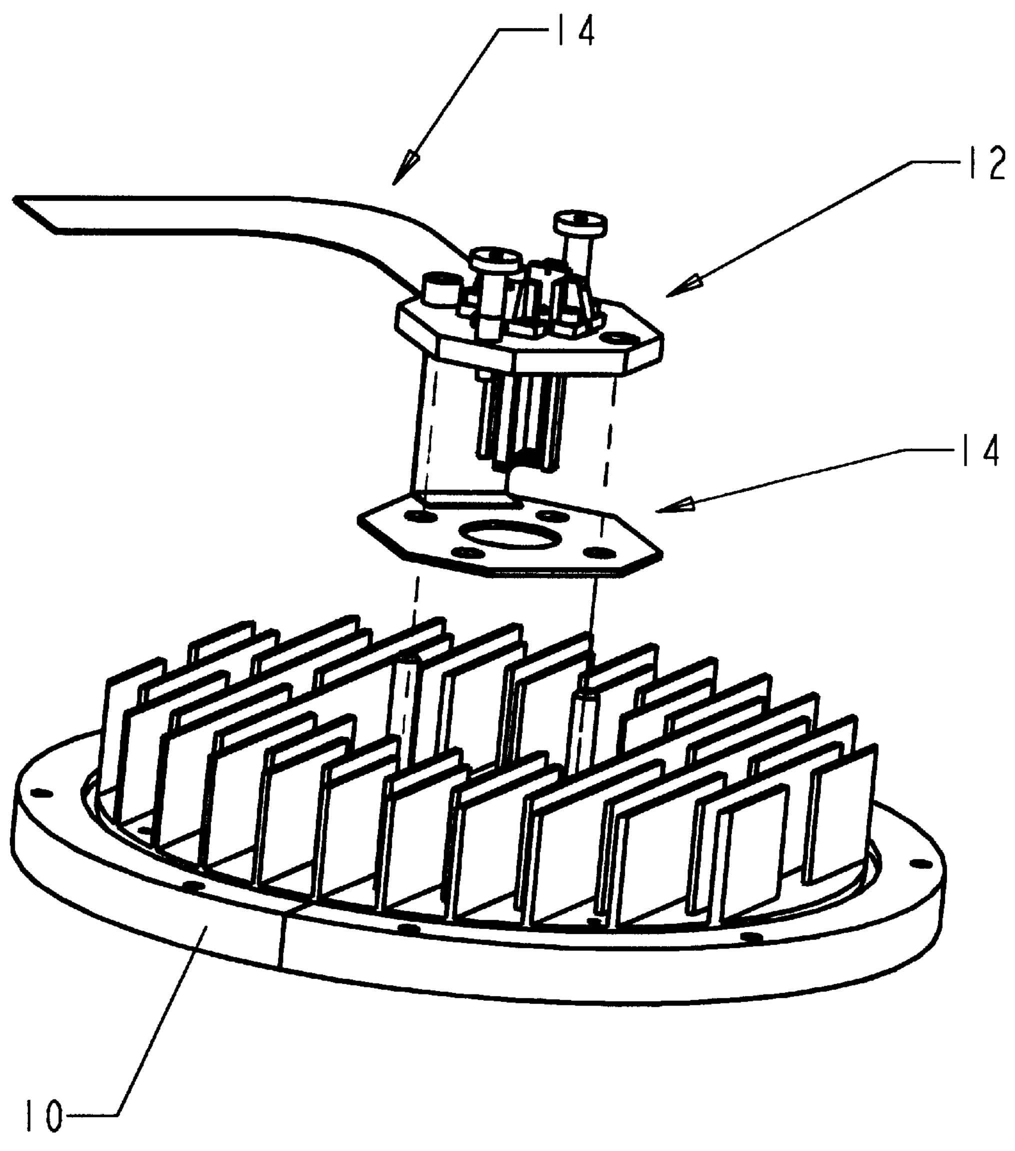
FIG. 1C is a top exploded pictorial diagram of the magnetic field generator, vertical probe card assembly, and interface/flex lead assembly of FIG. 1A.
Figure 1D:
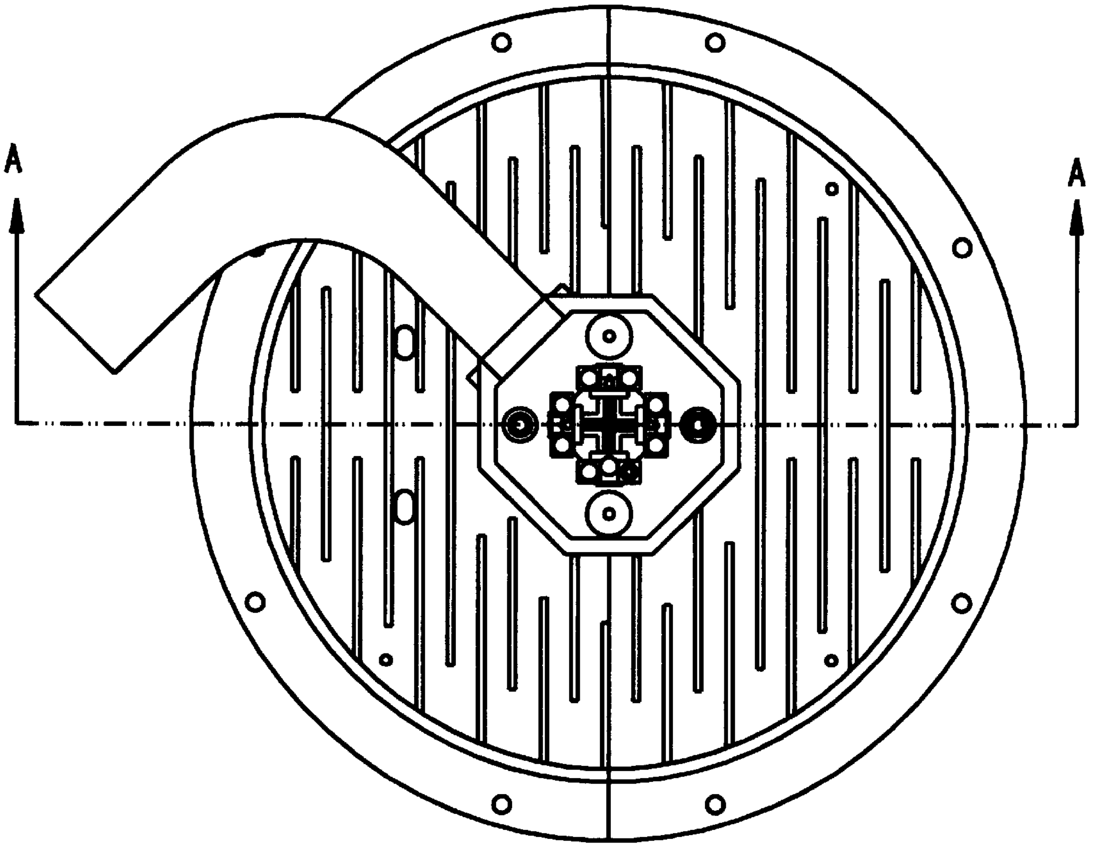
FIG. 1D is a top plan view of the magnetic field generator, vertical probe card assembly, and interface/flex lead assembly of FIG. 1A.
Figure 1E:
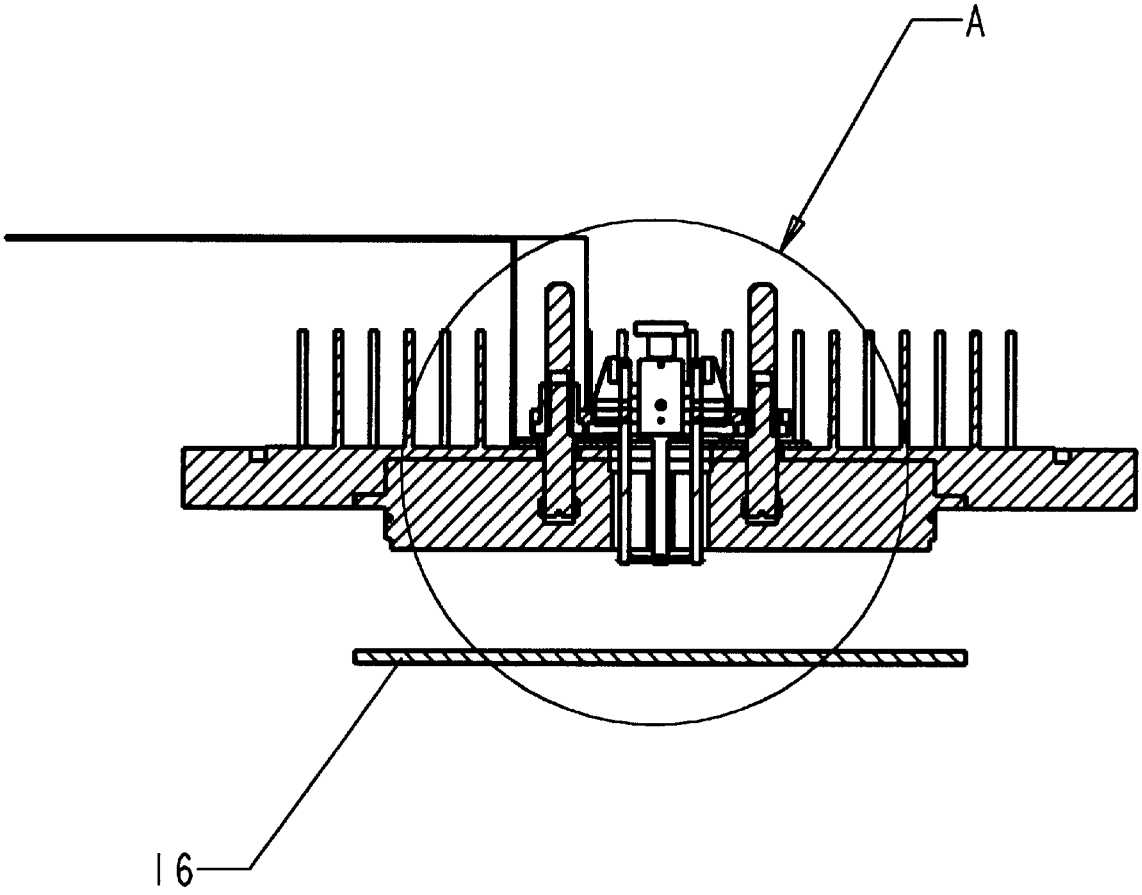
FIG. 1E is a sectional diagram of the magnetic field generator, vertical probe card assembly, interface/flex lead assembly, and device under test of FIGS. 1A, 1B, and 1D, taken along the line A—A of FIG. 1D.

Referring now to FIG. 1B, magnetic field generator 10 is positioned above the electrical/electronic device under test 16 such that the magnetic field produced by the magnetic field generator 10 will influence the physical properties of the device under test 16. Probe card/elevator assembly 12 is installed in the magnetic field generator 10 with probe needles 36 mounted on the probe card 42 passing through the magnetic field generator 10 via the central corridor 24. This configuration permits the probe needles 36 to come into physical and electrical contact with the device under test 16. The measurements of the device under test 16 that are sensed by the probe needles 36 are passed via the conductive traces on the probe card 42 to the interface needles 38. The interface needles 38 are in electrical contact with the interface card 26 which is electrically connected to the flex lead 28. The response of device under test 16, present at flex lead 28, may be analyzed by external equipment.

In order to use the vertical probe card 42 of the present invention, the probe card elevator assembly 12 of FIG. 4A is first installed within the magnetic field generator assembly 10 of FIG. 2A. This is accomplished by placing the probe card elevator assembly 12 over the magnetic field generator assembly 10 with the elevator guide sleeves 30, located on the probe card/elevator assembly 12, directly above the guide pins 20 of the magnetic field generator 10. The probe card/elevator assembly 12 is then lowered such that the guide pins 20 slide inside the elevator guide sleeves 30 to assure correct orientation of the probe card/elevator assembly 12 and to also assure that the probe needles 36 and probe cards 42 of FIG. 5B move freely and unimpeded through the central corridor 24 of the magnetic field generator 10. Once the hold down screws 34 contact the hold down nuts 22, they are tightened to secure the probe card/elevator assembly 12 within the corridor 24 of the magnetic field generator assembly 10.

The magnetic field generator assembly 10 with the probe card/elevator assembly 12 installed therein is now ready to provide electrical and magnetic stimuli to the device under test 16 of FIG. 1B and to acquire responses therefrom. The device under test 16 is moved into a position such that the probe needles 36 of FIG. 5B make contact with the appropriate test pads or other features thereof. While the magnetic field generator assembly 10 with the probe card/elevator assembly 12 installed therein provides stimulation to the device under test 16, electrical signals are conducted from the probe needles 36, through the probe card 42, to the interface needles 38. These signals pass from the interface needles 38 to the interface card 26 and then to the flex lead 28 where they may be connected to any desired external test equipment for analysis.

We claim:

1. An elongated probe card for conveying electrical stimuli signals to and receiving electrical response signals from a workpiece through a corridor in a magnetic field generator, wherein the probe card has opposed end portions and comprises:

a probe card mount affixed to a first end portion of the probe card for facilitating attachment of the probe card to an external frame member;

wherein a second end portion of the probe card is spaced from the probe card mount and located on an opposite side of the magnetic field generator from the first end portion of the probe card;

a multiplicity of probe needles affixed to the second end portion of the probe card and extend, outwardly therefrom, wherein each of the multiplicity of probe needles has a tip portion for contacting the workpiece; and a multiplicity of interface needles, corresponding in number to the multiplicity of probe needles, wherein the multiplicity of interface needles are affixed to the first portion of the probe card adjacent the probe card mount for conveying the electrical stimuli and response signals between the workpiece and external equipment, wherein the multiplicity of interface needles are spaced in distal relation to the multiplicity of probe needles;

wherein the probe card is adapted to enable each one of the multiplicity of probe needles to make electrical contact with a corresponding one of the multiplicity of interface needles.

2. The probe card as in claim 1, wherein the multiplicity of interface needles are generally disposed in a direction opposite that of the multiplicity of probe needles.

* * * * *